United States Patent [19]

Harte et al.

[11] Patent Number: 4,683,366

[45] Date of Patent: Jul. 28, 1987

[54] ALL ELECTROSTATIC ELECTRON OPTICAL SUB-SYSTEM FOR VARIABLE ELECTRON BEAM SPOT SHAPING AND METHOD OF OPERATION

[75] Inventors: Kenneth J. Harte, Carlisle; Guenther O. Langner, Westford, both of Mass.

[73] Assignee: Control Data Corporation, Minneapolis, Minn.

[21] Appl. No.: 749,789

[22] Filed: Jun. 28, 1985

[51] Int. Cl.$^4$ ............................................. B23K 15/00
[52] U.S. Cl. ...................... 219/121 ER; 219/121 ES; 250/491.1
[58] Field of Search .................. 219/121 ER, 121 ES; 250/491.1

[56] References Cited

U.S. PATENT DOCUMENTS 4,423,305 12/1983 Pfeiffer ...................... 219/121 ER X
4,430,570 2/1984 Takigawa et al. ............... 250/423 R

*Primary Examiner*—C. L. Albritton
*Attorney, Agent, or Firm*—Charles W. Helzer

[57] ABSTRACT

An all-electrostatic variable spot charged particle (electron) beam shaping sub-system which is compact and of much smaller size than known similar systems designed for the same purpose and operating with magnetic lenses. The improved electrostatic variable spot-shaping sub-system does not require mechanical rotation of the spot-shaping apertures for maintaining alignment or orientation. The improved sub-system includes both beam steering and beam blanking requiring less than 3 volts for operation of the blanking controls to turn the beam on and off. The novel system easily accomodates a variety of different beam-shaping apertures for use as the second beam shaping aperture in the sub-system including rectilinear triangles of different orientation to provide smooth 45 degree pattern delineation, rectangles, squares, and even different diameter circles where such configurations are required by a particular pattern to be written in the target plane.

14 Claims, 8 Drawing Figures

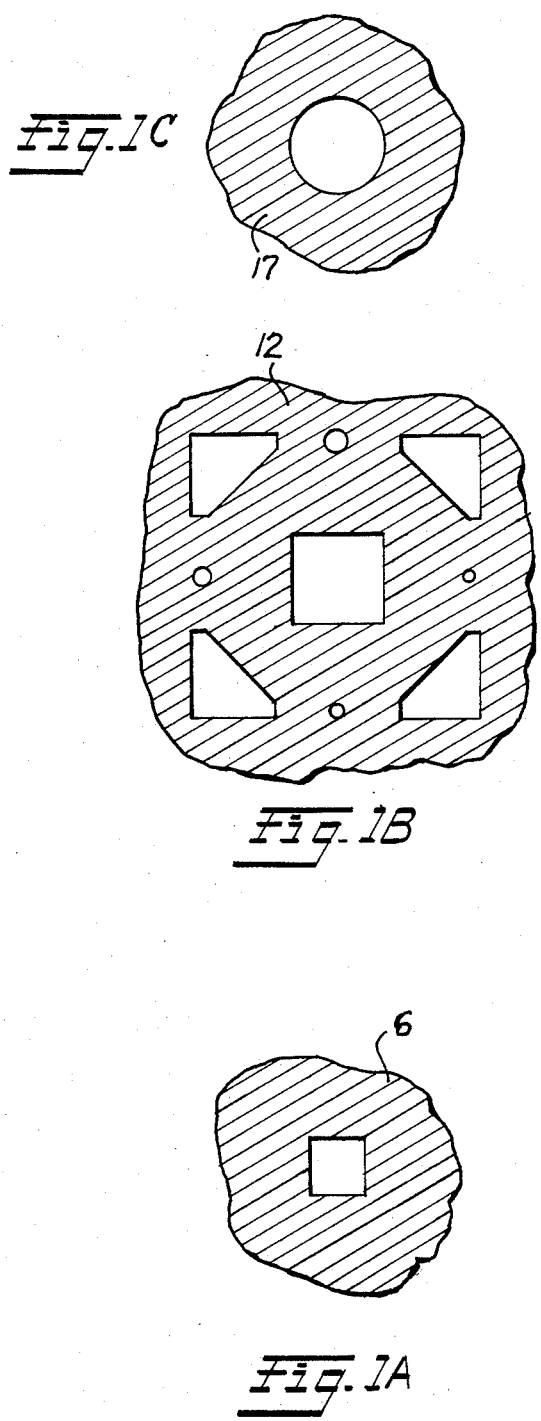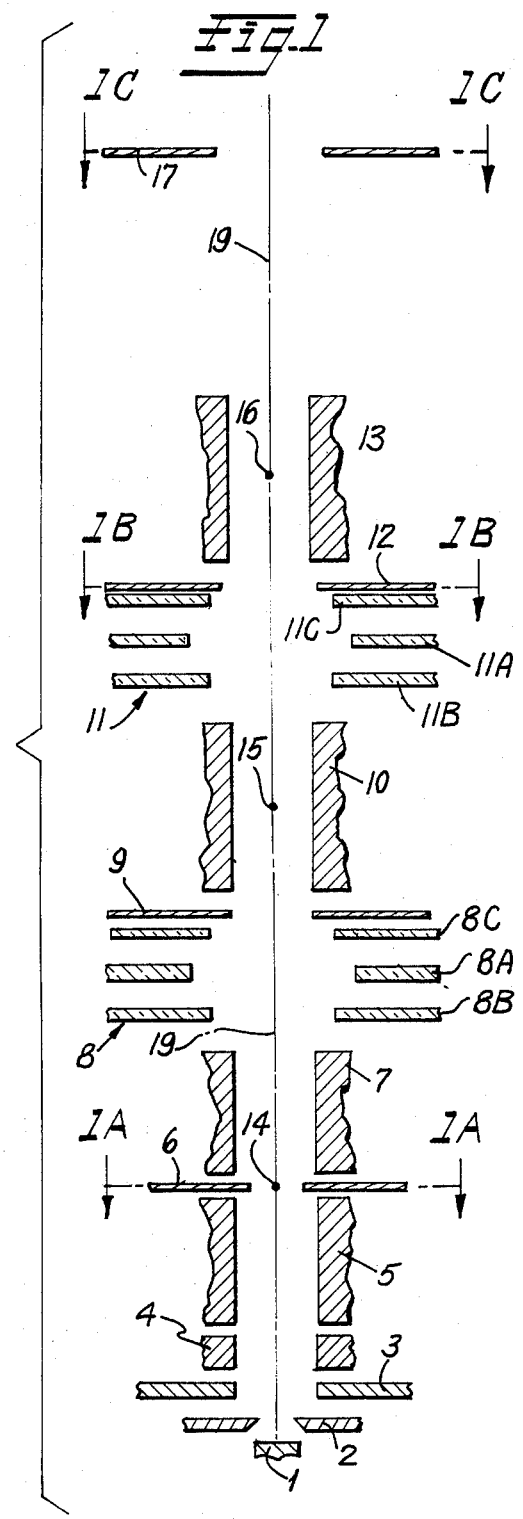

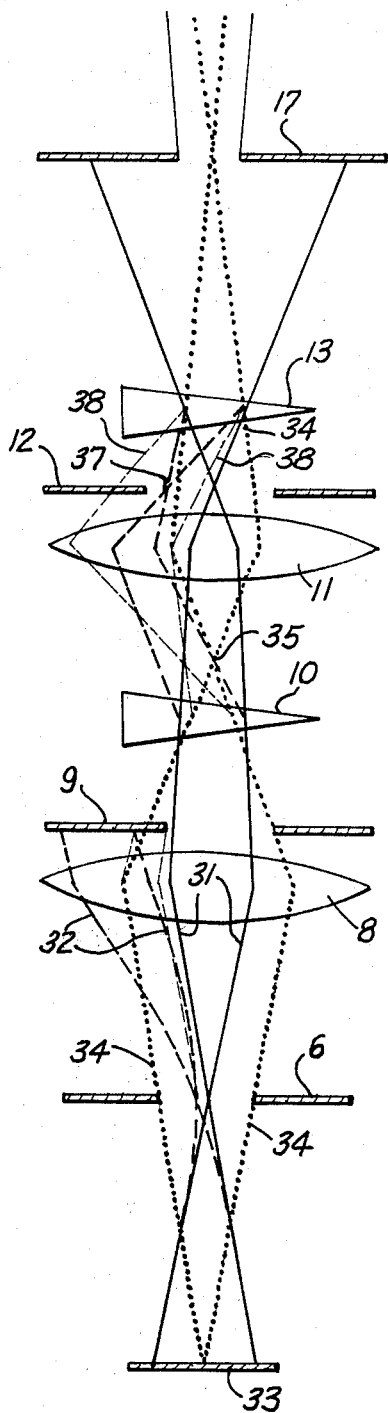
Fig. 2
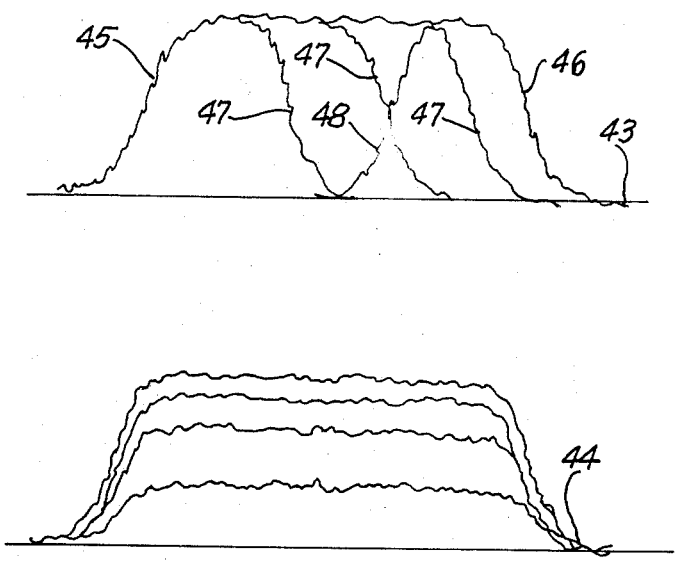
Fig. 4
Fig. 4A

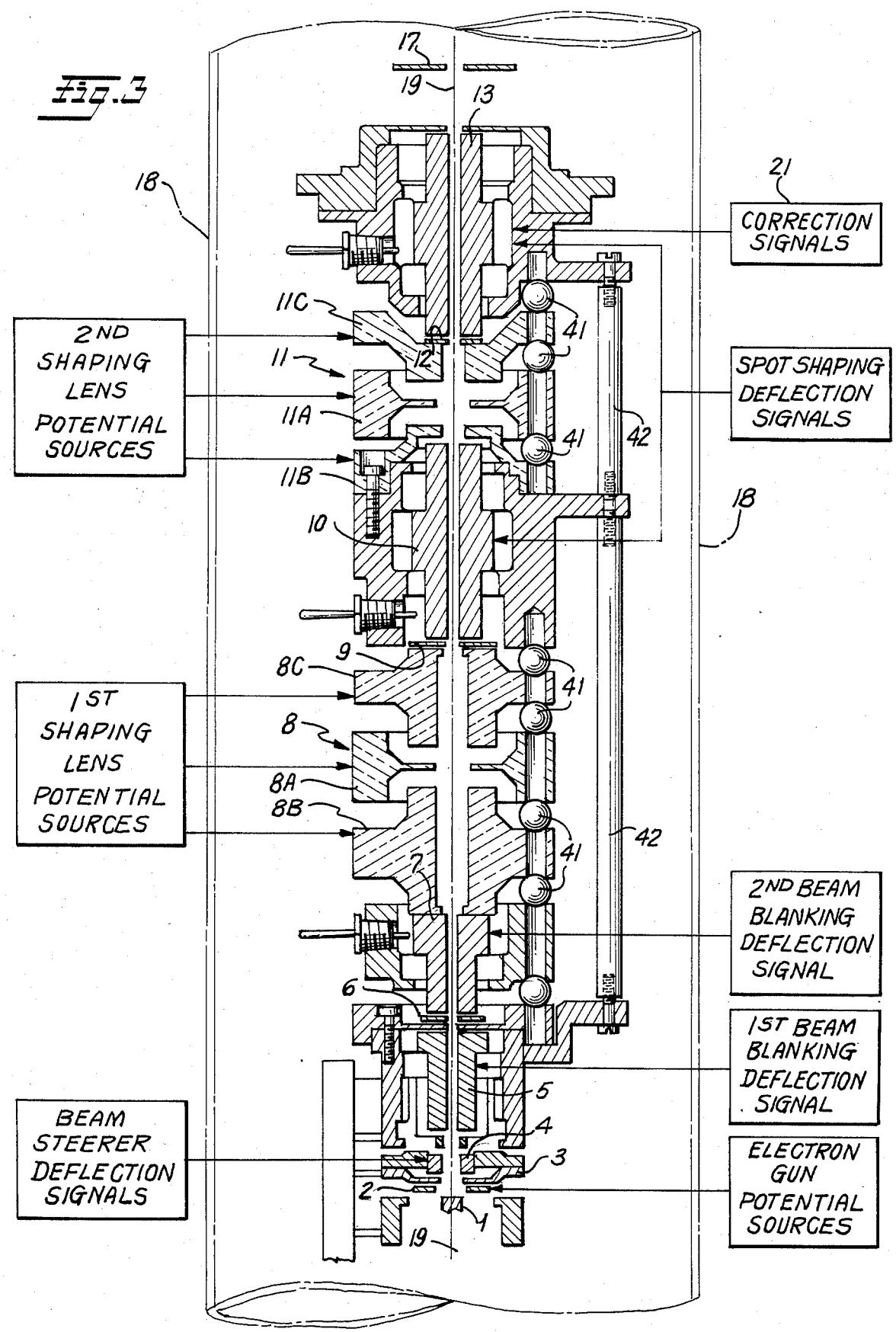

ALL ELECTROSTATIC ELECTRON OPTICAL SUB-SYSTEM FOR VARIABLE ELECTRON BEAM SPOT SHAPING AND METHOD OF OPERATION

TECHNICAL FIELD

This invention relates to an improved charged particle (such as an electron) beam spot-shaping sub-system and the method of operation for charged particle beam variable optical systems used for charged particle beam lithography.

More specifically, the invention relates to an all-electrostatic, electron beam optical sub-system for providing variable electron beam spot-shaping in an all-electrostatic, miniaturized electron-beam optical system designed for use in the direct electron beam writing on miniature target surfaces such as on a semiconductor target wafer for the fabrication of micro-miniaturized semiconductor integrated circuit chips.

BACKGROUND PRIOR ART

Known electron beam optical columns used in electron beam lithography systems employ an electron beam spot focused onto the target (either a reticle, mask, wafer or the like) which is either circular (Gaussian) or shaped. In the case of circular spots, they are generated by the demagnified gun crossover, are fixed in shape and spot positioning is continuous. In the case of shaped spots, the demagnified image of an aperture (typically of square shape), is used and the spot positioning is in increments of the spot size. For an example of this type of system, reference is made to U.S. Pat. No. 4,243,866 issued Jan. 6, 1981 for a "Method and Apparatus for Performing a Variable Size Electron Beam".

Using a shaped electron beam spot lithography system, a chip circuit pattern on a target surface can be generated significantly faster than with a Gaussian spot system because with the shaped spot system many pixels are written simutaneously. In the past, the type of patterns which could be written by a shaped spot system were limited to feature sizes in increments of the basic shaped spot size and to orthogonal patterns, otherwise overlapping had to be applied which would degrade the quality of the written pattern due to a so-called "blooming effect".

In order to make the shaped-spot concept more adaptable to a wider range of circuit patterns, lithography systems using variable spot-shaping have been successfully introduced such as those described in a publication entitled "Design of a Variable-Aperture Projection and Scanning System for Electron Beam"—E. Goto, T. Soma and M. Idesawa reported in the Journal of Vacuum Science Technology— 15(3), May/June 1978, pages 883–886. Also reported in the same publication is an article entitled "Variable Spot Shaping for Electron Beam Lithography" by H. C. Pfeiffer appearing on pages 887–890; an article entitled "Double-Aperture Method of Producing Variably Shaped Writing Spots for Electron Beam Lithography" by M. G. R. Thomson, R. J. Collier and D. R. Herriott on pages 891–895 and an article entitled "Dynamic Beam Shaping" by J. Trotel on pages 872–873. A variable spot-shaping system also is described in the above noted U.S. Pat. No. 4,243,866. All of these known systems are based on the principal that one spot-shaping aperture, typically of square shape, is electron-optically imaged onto a second aperture. The image of the first aperture is offset by deflection means so that it overlaps a part of the second aperture. The resulting composite image is somewhat truncated and is demagnified to form a focused spot of variable shape at the target surface.

All of the known variable-shaped spot electron beam systems mentioned above use magnetic lenses and operate in the so-called Koehler illumination scheme. This scheme was originally devised in 1896 for use as the illuminating condenser in a light microscope to separately control the illuminating semi-angle and the field. The Koehler illumination scheme is characterised in an electron beam optical system by using the electron gun crossover as the source which is imaged by a condenser lens (and typically a further demagnifying lens) into the object principal plane of the final objective lens and determines the maximum semi-angle in the pencil-like electron beam forming the finally imaged variably-shaped electron beam spot at the target plane.

The use of magnetic lens in known variably-shaped spot electron beam optical systems is motivated by the belief that they exhibit smaller optical aberations than electrostatic lens with the same focal length. However, magnetic lens have the disadvantage of rotating the image. When the image of the first spot-shaping aperture on the second spot shaping aperture is focused and has the correct (desired) size, it usually is not oriented correctly. Thus, some mechanical means must be and is provided in these known magnetic lens systems to rotate the spot-shaping apertures from outside the vacuum column to correct for the desired orientation. This increases the difficulty of setting up a variably shaped spot system considerably and also makes the design of the system more complicated and expensive.

A second and comparably severe disadvantage of magnetic lenses is their large size which makes them unsuitable for any application in which space is at a premimum. One such use would be in a multiple-channel electron beam lithography system such as that described in copending U.S. patent application Ser. No. 749,796, filed June 28, 1985 concurrently with this application entitled "Multiple Channel Electron Beam Optical Column Lithography System and Method of Operation", Kenneth J. Harte—inventor, and assigned to the Control Data Corporation. It should be noted, however, that in the known variably-shaped spot electron beam lithography systems using magnetic lens assemblies, the deflection means typically are electrostatic because of the inherently faster response of electrostatic deflectors. To obtain practical thru-put in such electron beam lithography systems, the shaping deflection has to occur within the time the spot is repositioned, typically taking 100 nanoseconds or less, to insure reasonable thru-put for the microcircuit pattern writing facility.

SUMMARY OF INVENTION

It is therefore a primary object of the present invention to provide an all-electrostatic, variable electron beam spot-shaping system which is compact (much smaller in size than known systems using magnetic lens), does not require mechanical rotational alignment of the spot-shaping aperture externally of the electron beam optical column, includes beam blanking requiring less than 5 volts and easily accomodates multi-shaped apertures as the second spot-shaping aperture in the system including, for example, squares, rectangles, isosceles right triangles of different orientations to produce smooth 45 degree pattern delineation, circles and the like.

In practicing the invention, an all-electrostatic electron beam spot shaping lens and deflector assembly is provided for mounting within an elongated evacuated housing along the optical axis of the undeflected electron beam path of an electron beam produced by an electron gun mounted at one end of the elongated housing. The electrostatic electron beam spot shaping lens and deflector assembly includes first and second spot shaping apertured plate members spaced apart a predetermined distance along the optical axis of the elongated housing and having spot shaping apertures formed therein. First and second electrostatic spot shaping lens sub-assemblies are mounted between the first and second spot shaping apertured plate members along the optical axis of the elongated housing and are spaced-apart a predetermined distance with relation to each other and the apertured plate members. First and second spot shaping electrostatic deflector sub-assemblies are mounted along the optical axis of the housing with the first spot-shaping deflector interposed between the first and second spot-shaping electrostatic lenses for imaging the aperture of the first spot-shaping apertured plate member onto the second spot-shaping apertured plate member to thereby produce a partially truncated image of the first spot shaping aperture for application to a target surface. The second spot-shaping electrostatic deflector is mounted immediately following the second spot-shaping apertured plate member in the direction of the electron beam path toward the target for redirecting the partially truncated electron beam image of the first spot-shaping aperture back to the optical axis of the undeflected electron beam to thereby avoid the need to correct the electron beam position at the target as electron beam shape is varied. In addition, the first and second electrostatic spot-shaping lens sub-assemblies also serves to image the electron beam source onto the object principal plane of the final objective lens of an optical system of which the spot shaping assembly comprises a part, or onto the plane of an additional demagnification lens which performs the same task.

In preferred embodiments of the invention, the first and second electrostatic electron beam spot-shaping lens sub-assemblies each comprises a three plate element Einzel lens structure having a center plate element and front and rear plate elements which form respective front and rear conjugate object and image planes. The center of deflection of the first spot-shaping deflector is located in the object plane, preferably spaced a distance of double the focal length of the second spot-shaping lens measured from its rear object principal plane and the center of the deflection of the second spot-shaping deflector is located in the object plane, preferably spaced a distance of double the focal length of the second spot-shaping lens measured from the image principal plane of the second spot-shaping lens whereby regardless of how the spot shape varies, it always is confined within the full square spot dimensions of the aperture in the first apertured plate member at the target plane.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters and wherein:

FIGS. 1 and 1A–1C comprise schematic, functional structural diagrams of a novel all-electrostatic, variable electron beam spot shaping lens and deflector assembly constructed according to the invention;

FIG. 2 is a functional operating sketch illustrating the elements of the novel electrostatic electron beam spot shaping lens and deflection assembly shown in FIG. 1, and illustrates the projected trajectories of both undeflected and deflected electron beams within the assembly;

FIG. 3 is a more detailed functional structural diagram illustrating the details of construction of an all-electrostatic, variable electron beam spot shaping lens and deflector assembly according to the invention;

FIG. 4 illustrates various electron beam spot profiles in the form of differentiated signals obtained from differently-shaped focused spots in the target plane as they are scanned across an edge orthogonal to the direction in which spot-shaping occurs; and FIG. 4A shows the differentiated signals representative of the spot profiles when the differently-shaped spots are scanned across an edge parallel or orthogonal to the direction in which spot-shaping occurs in the target plane.

BEST MODE OF PRACTICING INVENTION

FIG. 1 of the drawings is a schematic structural diagram of a preferred form of the invention which employs a thermionic cathode triode gun consisting of a cathode 1, a control grid 2 and an anode 3 of known construction. A beam steering four-fold electrostatic deflector 4 is provided adjacent the electron gun for aligning the electron beam produced by the electron gun along the undeflected optical axis 19 of the system and onto the electron beam spot-shaping aperture of a first spot shaping apertured plate 6. The square configuration of the first spot-shaping aperture in plate 6 is shown in the planar view shown in FIG. 1A.

The preferred embodiment of the invention incorporates beam blanking for fast turn-on and turn-off of the electron beam in a known manner. For this purpose, first and second beam blanking electrostatic deflector assemblies 5 and 7 are axially spaced apart along the undeflected electron beam optical axis shown by dotted line 19 of the spot shaping lens and deflector assembly. The first beam blanking deflector 5 is mounted centered on the electron beam optical axis 19 immediately adjacent the beam steering deflector 4 on the side thereof away from the electron gun. The first spot-shaping apertured plate 6 is interposed between the axially spaced apart beam blanking deflectors 5 and 7 as shown in FIG. 1. The beam blanking deflectors are two-fold electrostatic deflectors each consisting of a pair of deflection plates for deflection in one direction only with both deflectors being wired in parallel. The common effective center of deflection of the beam blanking deflectors 5 and 7 is located at a point 14 shown in FIG. 1 which is in the center of the first spot shaping aperture in plate 6. Consequently, the position of the spot in the target plane does not move during blanking and unblanking of the electron beam by the beam blanking deflectors 5 and 7.

The all-electrostatic variable spot-shaping lens and deflector assembly itself is comprised by a first electrostatic condenser or shaping lens sub-assembly that comprises a three plate element electrostatic Einzel lens 8 formed by a center plate element 8A, and front and back plate elements 8B and 8C, respectively. The first spot shaping electrostatic lens sub-assembly 8 is followed by a blanking apertured plate 9 having a circular aperture opening therein shown in FIG. 1B. When a large enough voltage is applied to the blanking deflectors 5 and 7, the electron beam will be deflected so that it is intercepted by the frame of apertured plate 9 as depicted in the electron beam trajectory diagrams of FIG. 2. In FIG. 2, the dashed lines 32 indicate a bundle of rays 31 which are blanked by the side edges of the blanking plate 9 upon the electron beam being deflected by the blanking deflectors 5 and 7. In a particular embodiment of the invention reduced to practice, less than three volts were sufficient to obtain blanking of the electron beam in the manner shown by the rays 32 in FIG. 2

The first condenser or spot-shaping lens sub-assembly 8 is paired with a second spot-shaping condenser lens sub-assembly 11 of similar three plate element 11A, 11B, 11C Einzel lens construction. Interposed between the first spot-shaping lens 8 and the second spot-shaping lens 11 is a first spot-shaping deflector sub-assembly 10 which is centered about the optical axis 19 and coacts with the two spot shaping lens 8 and 11 to deflect the electron beam image of aperture 6 onto a desired one of a plurality of differently shaped and oriented second beam shaping apertures formed in a second spot-shaping apertured plate 12 mounted on the electron beam column immediately adjacent the back plate 11A of the second spot-shaping lens 11. This results in producing a partially truncated image of the aperture of the first spot shaping apertured plate 6 of desired size and orientation for application to a target surface.

The two condenser spot-shaping lens 8 and 11 also coact to fulfill a second task of imaging the source (crossover) shown at 33 in FIG. 2 which occurs physically close to the cathode 1 shown in FIG. 1, onto the object principal plane of the final lens of an optical column with which the spot shaping assembly is used, or to image the source onto a conjugate plane of said object principal of an additional demagnification lens (not shown) which performs the same task of imaging the source onto the object principal plane of the final objective lens of an overall optical lithography system. If one additional demagnification lens (not shown) is used in the system, a beam limiting apperture 17 shown in FIG. 1C is arranged in front of it in the conjugate plane where the lens 11 images the source 33 as shown generally at 35 in FIG. 2. The electron beam does not move across limiting aperture 17 during shaping as described hereafter.

The above briefly described two tasks performed by the all-electrostatic spot-shaping lens 8 and 11 in conjunction with the serially arranged two spot-shaping electrostatic deflectors 10 and 13 is illustrated in FIG. 2. FIG. 2 shows how lenses 8 and 11, when properly positioned and focused, treat a bundle of rays 34 shown in dotted line form emerging from a point in the source 33 until it converges into the final objective lens of an optical system with which the beam shaping assembly is used, or into the center of the limiting aperture 17 in the event an additional demagnifying lens (not shown) is used. FIG. 2 also illustrates how the spot shaping electrostatic lenses 8 and 11 treat a bundle of rays 31 shown in solid line form that emerge from a point in the first spot shaping aperture 6 and to be focused on the second spot shaping aperture 12. FIG. 2 also illustrates how the arrangement of the second electrostatic spot shaping deflector 13 treats the partially truncated electron beam image (depicted by the bundle of rays 37) of the first spot-shaping aperture leaving the second spot shaping aperture 12 to redirect it back to the optical axis of the undeflected electron beam and thereby avoid the need to correct the electron beam spot position at the target as the electron spot shape is varied. The spot-shaping deflectors 10 and 13 are conventional four-fold deflectors of known construction.

At this point in the description, it is well to note that the arrangement of the spot shaping deflectors 10 and 13 in the present invention differs from the arrangements typically used in the known spot-shaping systems described in the above-noted prior art references that use magnetic lenses. In the known prior art variable spot-shaping systems, the deflection means are entirely contained between the two condenser lenses comprising a part of the variable electron beam spot-shaping optical sub-system. In such systems the effective deflection center of the deflection means has to coincide with the position of the intermediate image of the source, otherwise the position of the source image in the principal plane of the final objective lens of an overall electron optical lithography system with which the spot-shaping sub-assembly is used, changes with spot-shaping resulting in a change of current density in the electron beam spot at the target plane with consequent adverse effects on the electron beam writing being performed.

In the arrangement according to the invention, the above stated conditions required in the prior art systems does not need to be met. Neither does applicants' arrangement require the use of magnetic lens sub-assemblies with all of their attendant disadvantages of large size, stray magnetic field effects, mechanical adjustment of image orientation, etc. In applicants' novel all-electrostatic variable spot-shaping assembly the deflection centers of the two electrostatic spot-shaping deflectors 10 and 13 coincides by design with the conjugate principal planes of the second spot shaping electrostatic lens sub-assembly 11. In a preferred embodiment of the invention, the deflection center 15 of the first spot shaping deflector 10 is spaced a distance of double the focal length of the lens 11 measured from the rear principal plane 11C, and the deflection center 16 of the second spot shaping deflector 13 is spaced the same distance of double the focal length of the lens 11 measured from the front focal plane 11B of the Einzel lens structure 11. By this arrangement, using physically and electrically identical deflector sub-assemblies 10 and 13, the deflection achieved appears to be optically compensated by the focusing properties of the lens 11. Regardless of the amount of electron beam shaping deflection, the bundle of rays forming the first spot-shaping aperture 6 image leaving the system remain apparently stationary relative to a target surface. This is indicated in FIG. 2 by the dashed electron beam ray bundle 37 relating to points in the spot shaping apertures, as compared to the undeflected bundle 31, and the dash-dotted bundle of rays 38 relating to the deflected electron beam source image as compared to the undeflected source image represented by dotted bundle 34.

An important consequence of the above disclosed all-electrostatic variable spot shaping deflection scheme is the fact that the image of the first spot shaping aperture 6 remains stationary at the target plane, and the superimposed image of the second spot shaping aperture 12 appears to move with respect to the stationary image of the first spot shaping aperture. In this way, regardless of the extent that the spot shape varies, it always is confined to within the full square spot shape area of the first spot shaping aperture 6 at the target plane. This makes it possible to use extended patterns for the second spot shaping aperture 12 such as squares, rectangles, isosceles triangles of different orientation and even circles of different size as shown in FIG. 1B where a prospective microcircuit pattern to be written requires such varied configurations in the spot shape of the writing electron beam.

FIG. 4 of the drawings shows the shaped spot profile resulting from spot-shaping of the electron beam in the above described manner and represents the differentiated signal obtained from the focused, shaped spot in the target plane scanned across an edge orthogonal to the direction in which the shaping occurs. In FIG. 4 the curve segments 45 and 46 represent the edges of the first shaping aperture 6 spot image which remain stationary and defines the outer limits of the writing electron beam spot in the target plane. The segments 47 and 48 represent the edge of the image of the second shaping aperture 12 and appear to move as the spot shape and size in the target plane is varied. FIG. 4A illustrates the differentiated signal obtained from the focused and shaped spot in the target plane as it is scanned across an edge parallel to the direction in which the shaping occurs and with respect to which it will be seen that the electron beam current of the shaped spot varies proportionally with the size of the spot in the target plane.

The manufacturing techniques used in the fabrication of the novel all-electrostatic electron-optical system for variable spot-shaping permits accurate prealignment of all of the apertures 6, 9, 12 and 17. In this technique, as shown in FIG. 3 of the drawings, the apertured plates, machined electrostatic lens elements and brazed deflector elements all are axially-arrayed and centered along the undeflected electron beam axis 19 of the electron optical column by means of ceramic balls 41 which sit into precisely machined complementary seats previously formed on the respective elements. There are four balls with one at each corner of the element in question although in the drawings only one such ball is shown for convenience. The entire variable spot-shaping lens and deflector assembly including the electron gun, the beam steering deflectors and the blanking deflectors are held together by four rods 42 made of nonmagnetic material, for example "316" stainless steel (only one of which is shown) spaced around the circumference of the assembly which then is mounted within an outer, elongated, evacuated housing shown in phantom lines at 18.

The second variable spot-shaping apertured plate 12 shown in the planar view to the left in FIG. 1 has actually been used in a working embodiment of the invention. Features in the target plane delineated by 45 degree lines can be written smoothly with an isosceles triangle of desired orientation in addition to all kinds of rectangles confined by the maximum square spot defined by the first spot shaping aperture in plate 6. In the specific embodiment reduced to practice, the maximum square spot was 50 micrometers at the second apertured plate 12 and 5 micrometers at the target plane as a result of the demagnification by a factor of ten. In this embodiment of the invention, voltages applied to the two variable spot-shaping deflectors 10 and 13 were nominally identical and under 10 volts. In order to compensate for mechanical errors in the system, means shown at 21 in FIG. 3 were provided for applying small correction voltages to deflector 13 to correct for offsets, gain, rotation and the like.

The resulting electron-optical variable spot-shaping lens and deflector assembly fabricated in the above briefly described manner is so compact that the electrostatic lenses have quite small focal lengths of the order of fractions of an inch. Consequently, their aberrations can easily be kept small enough not to seriously affect the image sharpness at the target plane. In the embodiment of the invention reduced to practice, the aberrations were kept below 50 nanometers as referenced to the final image in the target plane. It should also be noted that the electron beam semiangle of the pencil-like electron beam produced by the variable spot-shaping sub-system typically is 0.5 milliradians or less at the planes of the shaped apertures 9 and 12.

INDUSTRIAL APPLICABILITY

From the foregoing description, it will be appreciated that the invention makes available to industry an all-electrostatic, electron beam optical sub-system for providing variable electron beam spot shaping capability for use in an all-electrostatic, miniaturized electron beam optical system that is designed for direct electron beam writing on the target surface of a semiconductor target wafer in the fabrication of micro-miniaturized semiconductor integraed circuit chips.

While a particular embodiment of the invention has been described for use with electron beams, it is believed obvious to those skilled in the art that the system and teachings herein disclosed can be employed equally well with other charged particle beams such as positive or negative ion beams. In addition, while the embodiment of the invention has been described for use principally in charged particle lithography, it also can be used with charged particle beam readout systems for the read-out of charged particle emissive target surfaces.

Having described one embodiment of an all-electrostatic charged particle optical sub-system for variable beam spot shaping and method of operation in accordance with the invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. An all electrostatic charged particle beam variable spot-shaping lens and deflector assembly to be mounted within an elongated evacuated housing along the optical axis of the undeflected charged particle beam path of a charged particle beam produced by a charged particle gun mounted at one end of the elongated housing;

said electrostatic charged particle beam spot shaping lens and deflector assembly including first and second spot shaping apertured plate members spaced apart a predetermined axial distance along the optical axis of the assembly and having spot shaping apertures formed therein, first and second electrostatic spot shaping lens sub-assemblies mounted between the first and second spot shaping apertured plate members along the optical axis of the assembly housing and spaced-apart a predetermined distance with relation to each other and the apertured plate members, and first and second spot shaping electrostatic deflector means mounted along the optical axis of the assembly with the first spot-shaping deflector means interposed between the first and second spot shaping electrostatic lenses for imaging the aperture of the first spot shaping apertured plate member onto the second spot shaping apertured plate member to thereby produce a partially truncated image of the first spot shaping aperture for application to a target surface, and said second spot-shaping electrostatic deflector means being mounted immediately following the second spot-shaping apertured plate member in the direction of the charged particle beam path for restoring the partially truncated charged particle beam image of the first spot shaping aperture back to the optical axis of the undeflected beam to thereby avoid the need to correct the beam spot position at the target plane as the charged particle beam shape is varied.

2. An electrostatic charged particle beam spot-shaping lens and deflector assembly according to claim 1 wherein the first and second electrostatic spot-shaping lens sub-assemblies in tandem image the first shaping aperture onto the second shaping aperture plane and simultaneously by proper choice of the optical distance of the first of the demagnifying optical lenses images the charged particle beam source onto the principal plane of the final objective lens of an optical system of which the spot shaping assembly comprises a part or onto the principal plane of an additional demagnification lens which performs the same task.

3. An electrostatic charged particle beam spot shaping lens and deflector assembly according to claim 2 wherein the first and second electrostatic charged particle beam spot shaping lens sub-assemblies comprise three-plate element Einzel lens structures having a center plate element and front and rear plate elements generating a pair of front and rear conjugate planes; and wherein the center of deflection of the first spot shaping electrostatic deflector sub-assembly is located in the front conjugate plane, preferably spaced a distance of double the focal length of the second spot shaping lens measured from its object principal plane and the center of deflection of the second spot-shaping electrostatic deflector sub-assembly is located in the rear conjugate plane, preferably spaced a distance of double the focal length of the second spot-shaping lens measured from the image principal plane of the second spot-shaping lens whereby regardless of how the spot shape varies, it always is confined within the full spot area dimensions of the image of the first aperture at the target plane.

4. An electrostatic charged particle beam spot shaping lens and deflector assembly according to claim 3 wherein the assembly further comprises an charged particle gun sub-assembly for producing a focused charged particle beam directed at the spot shaping lens and deflector assembly from one end of an elongated evacuated housing in which the assembly is designed to be mounted, and a charged particle beam steering deflector sub-assembly mounted intermediate the charged particle gun and the first spot shaping apertured plate member for aligning the beam so that it is directed along the optical-axis of spot shaping lens and deflector assembly and centered on the aperture in the first spot shaping apertured plate member.

5. An electrostatic electron beam spot-shaping lens and deflector assembly according to claim 4 wherein the assembly further comprises first and second electron beam blanking deflector sub-assemblies an a third beam blanking apertured plate axially positioned along the optical axis of the spot-shaping lens and deflector assembly with the beam blanking deflectors positioned on opposite sides of the first spot-shaping apertured plate member and with their common effective center of deflection located in the center of the first spot-shaping aperture whereby the position of the electron beam spot can be deflected to impinge upon the sides of the blanking apertured plate for blanking purposes but does not move in the target plane with blanking and unblanking of the electron beam.

6. An electrostatic electron beam spot shaping lens and deflector assembly according to claim 1 wherein the assembly further includes means for applying correction voltages to at least the second spot shaping deflector for correcting for offset, gain, non-orthogonality and other similar variables affecting the quality of electron beam writing in the target plane.

7. An electrostatic electron beam spot shaping lens and deflector assembly according to claim 5 wherein the assembly further includes means for applying correction voltages to at least the second spot shaping deflector for correcting for offset, gain, and non-orthogonality of the shaping deflection and other similar variables affecting the quality of electron beam writing in the target plane.

8. An electrostatic electron beam spot shaping lens and deflector assembly according to claim 2 wherein a third electron beam optical system limiting aperture is located along the electron beam optical axis of the assembly in the focal plane where the electron beam source is imaged by the first and second electrostatic spot-shaping lens sub-assemblies.

9. An electrostatic electron beam spot shaping lens and deflector assembly according to claim 7 wherein a fourth electron beam optical system limiting aperture is located along the electron beam optical axis of the assembly in the plane where the electron beam source is imaged by the first and second electrostatic spot-shaping lens sub-assemblies.

10. The method of precisely shaping the cross-sectional size and configuratin of an electron beam used for direct electron beam writing on a target surface in an electron beam lithography system using an all electrostatic electron beam spot-shaping lens and deflector assembly mounted within an elongated evacuated housing along the optical axis of the undeflected electron beam path of an electron beam produced by an electron gun mounted at one end of the housing, said electrostatic electron beam spot-shaping lens and deflector assembly including first and second spot-shaping apertured plate members spaced apart a predetermined axial distance along the optical axis of the elongated housing and having spot-shaping apertures formed therein, first and second electrostatic spot-shaping lens sub-assemblies comprised by three plate element Einzel lens structures having center, front and back plate elements, respectively, mounted between the first and second spot shaping apertured plate members along the optical axis of the elongated housing and spaced-apart a predetermined distance with relation to each other and the apertured plate members, and first and second spot shaping electrostatic deflector sub-assemblies mounted along the optical axis of the housing with the first spot shaping deflector sub-assembly interposed between the first and second spot shaping electrostatic lens sub-assemblies, and said second spot shaping electrostatic deflector sub-assembly being mounted immediately following the second spot shaping apertured plate member in the direction of the electron beam path; said method comprising:

imaging the first spot shaping aperture onto the second spot shaping aperture while simultaneously imaging the electron beam source crossover point onto the principal plane of focus of the final lens or an intervening demagnification lens employed in an electron beam optical system with which the electron beam spot shaping lens and deflector assembly is used, maintaining the deflection center of the first spot shaping deflector a distance of double the focal length of the second electrostatic spot shaping lens measured from its rear principal plane and maintaining the deflection center of the second spot shaping deflector a distance of double the focal length of the second electrostatic spot shaping lens measured from its front principal plane to thereby cause the image of the first spot shaping aperture to remain stationary relative to a target surface and the superimposed image of the second spot shaping aperture appear to move relative to the stationary image of the first aperture to thereby vary the spot size and shape while always being confined within the full spot dimensions of the first spot shaping aperture.

11. The method according to claim 10 wherein the electrostatic electron beam spot-shaping lens and deflector assembly further includes first and second beam blanking deflectors axially positioned along the optical axis of the electron optical system on opposite sides of the first apertured plate member and wherein the method further includes locating the common effective center of deflection of the first and second beam blanking deflectors centered in the plane of the first spot-shaping aperture whereby the position of the electron beam spot at the target plane does not move with blanking and unblanking of the electron beam.

12. The method according to claim 11 further including applying correction voltages to at least the second spot-shaping deflector for correcting for offset, gain, rotation and other similar variables affecting the quality of electron beam writing in the target plane.

13. The method according to claim 10 further including providing an electron beam optical system limiting aperture located along the electron beam system optical axis of the assembly in the focal plane where the electron beam crossover source is imaged by the first and second electrostatic spot-shaping lens sub-assemblies.

14. The method according to claim 12 further including providing an electron beam optical system limiting aperture located along the electron beam system optical axis of the assembly in the focal plane where the electron beam crossover source is imaged by the first and second electrostatic spot shaping lens sub-assemblies.

* * * * *